United States Patent

Metz

[15] 3,688,303

[45] Aug. 29, 1972

[54] SYNCHRO-TO-DIGITAL CONVERTER

[72] Inventor: Louis C. Metz, St. Paul, Minn.

[73] Assignee: Sperry Rand Corporation, New York, N.Y.

[22] Filed: June 10, 1970

[21] Appl. No.: 45,079

[52] U.S. Cl. .............................................340/347 SY
[51] Int. Cl. .............................................H03k 13/02
[58] Field of Search ......340/347; 235/154, 197, 186; 318/661

[56] References Cited

UNITED STATES PATENTS

| | | |
|---|---|---|
| 3,250,905 | 5/1966 | Schroeder et al......340/347 X |
| 3,295,125 | 12/1966 | Idelsohn et al. ...........340/347 |
| 3,516,084 | 6/1970 | Sacks et al................340/347 |

*Primary Examiner*—Maynard R. Wilbur
*Assistant Examiner*—Charles D. Miller
*Attorney*—Kenneth T. Grace, Thomas J. Nikolai and Joh P. Dority

[57] ABSTRACT

A shaft-angle to digital-data converter that compensates for the nonlinear relationship between a given shaft angle $\theta$ and its trigonometric function as represented by first and second analog voltage signals $E_1$, $E_2$. The converter operates over the shaft angle $\theta$ range of 0° to 45° having a maximum error of 5 minutes of arc. The 45° range is divided into three angular segments with appropriate resistors selectively coupled to an operational amplifier to control its gain so as to generate the variable bias signal for biasing a resistor ladder in the desired manner. Selected bits of an approximated data word selectively couple-in the appropriate resistors while all the bits of the approximated data word are coupled to the resistor ladder. The current signal output of the resistor ladder and a current signal that is generated by the first analog voltage signal $E_1$ are compared by a comparator which comparison provides, as an output, a binary signal. The binary signal increments or decrements the bits of the approximated data word achieving a final data word using the successive approximation method. The final data word represents the digital value $\theta_D$ of the shaft angle $\theta$ as represented by the first and second analog voltage signals $E_1$, $E_2$.

3 Claims, 5 Drawing Figures

INVENTOR
LOUIS C. METZ

BY Kenneth S. Grace
ATTORNEY

INVENTOR
LOUIS C. METZ

BY Kenneth T. Grace
ATTORNEY

INVENTOR
LOUIS C. METZ
BY Kenneth T Grace
ATTORNEY

SYNCHRO-TO-DIGITAL CONVERTER

BACKGROUND OF THE INVENTION

The present invention relates to devices for converting an angular quantity, such as the angle of rotation of a synchro element, to its digital equivalent. Such devices have been characterized into many classes - see the series of five publications "Synchro-to-Digital Converters," Hermann Schmid, Electronic Design 6, beginning Mar. 15, 1970 — and are a specific class of analog-to-digital converters.

The present invention involves the incorporation of a resistance network in an otherwise old converter system for linearizing the otherwise nonlinear relationship of a given shaft angle $\theta$ and its trigonometric function as represented by first and second analog voltage signals K sin $\theta$ and K cos $\theta$. The converter system includes an input multiplexer that scans a plurality of synchro output voltage signals K sin $\theta$, K cos $\theta$ that are representations of the synchro shaft angle $\theta$. The two scanned signals are coupled to a sample and hold device and thence to an octant detector that determines the particular octant in which the particular shaft angle $\theta$ lies (and which, in doing so, determines the relative magnitudes of the two scanned signals). The smaller signal, designated $E_1$, is coupled to a first input terminal while the larger signal, designated $E_2$, is coupled to a second input terminal.

From the first and second signals $E_1$, $E_2$ a reference signal $-E_3$ is generated that biases a resistance ladder network. Bits from a data register, holding an approximated data word, are coupled to the resistance ladder network generating an output current signal $-I_2$ that at a comparator is compared to a current signal $I_1$ generated by signal $E_1$. The comparator compares $I_1$ to $-I_2$ generating a current signal $I_3$, i.e., $I_1 - I_2 = \pm I_3$, which through the comparator alternatively couples a binary signal "1" or "0" to control logic which then adjusts the approximated data word held in the data register. Through the successive approximation method - see the publication "Specifying Analog-to-Digital Converters", Jay Freeman, The Electronic Engineer, June 1968, pages 44 -48 particularly FIGS. 1, 2 page 45 — the approximated data word is stepwise corrected to the final data word representing $\theta_D$.

SUMMARY OF THE INVENTION

The present invention incorporates a linearizing network in an otherwise old analog digital converter system for linearizing the otherwise nonlinear relationship between a given shaft angle $\theta$ and its trigonometric function. The linearizing network includes a plurality of resistors that through associated analog switches selectively couple the voltage signals $+E_1$ and $+E_2$ to an operational amplifier generating a reference signal $-E_3$. The reference signal $-E_3$ biases the R, 2R resistance ladder network the steps of which are coupled to and enabled by the associated "1" bits of the approximated data word held in a data register. The resistance ladder network generates a current signal $-I_2$ which is compared to a current signal $+I_1$ provided by $E_1$. The comparison generates a third current signal $\pm I_3$ which drives a comparator providing, alternatively, binary output signals "1" or "0" if the comparison signal is $+I_3$ or $-I_3$, respectively.

The binary signal drives control logic which adjusts the bits of the approximated data word in the corresponding manner. The three highest ordered bits, C11, C10, C09 of the approximated data word, through switching logic, condition, i.e., enable or disable, the analog switches which in turn, by changing the gain of an operational amplifier, change the reference voltage $-E_3$ and the comparison signal $\pm I_3$. The process of successive approximation continues until the lowest ordered bit in the approximated data word is set or cleared, i.e., is a "1" or a "0", providing the final digital data word that represents the value $\theta_D$.

DESCRIPTION OF THE PREFERRED EMBODIMENT

Figure 1:
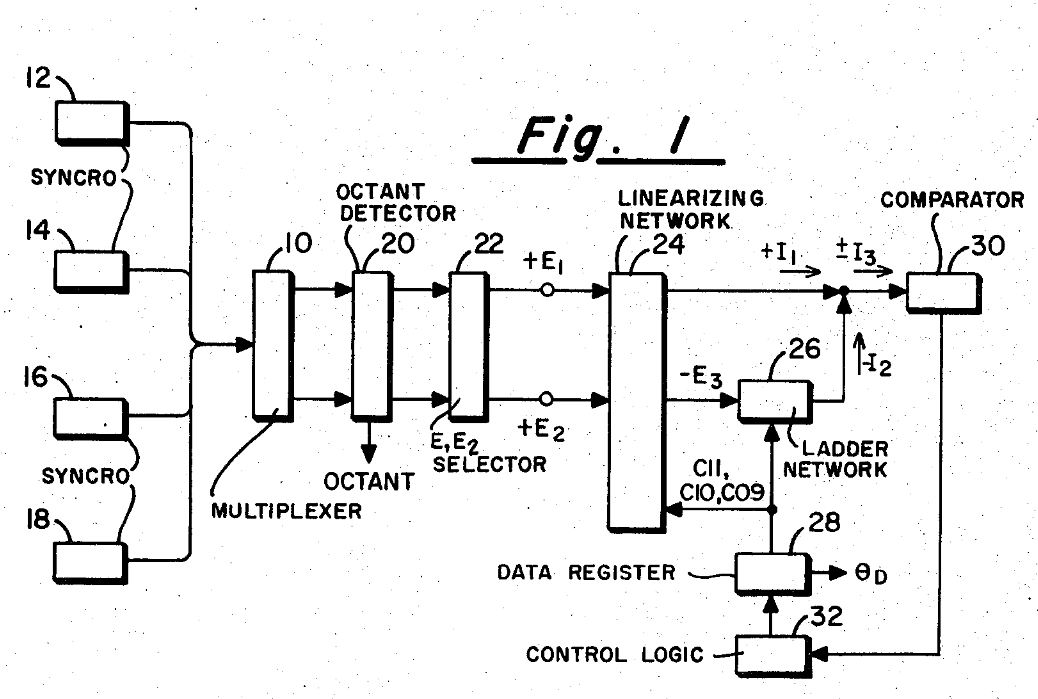
FIG. 1 is a block diagram of an analog-to-digital converter system into which the present invention is incorporated.

With particular reference to FIG. 1 there is presented a block diagram of an analog-to-digital converter system into which the present invention is incorporated. The converter system includes an input multiplexer 10 that scans a plurality of synchros 12, 14, 16, 18 each providing their associated output voltage signals K sin $\theta$, K cos $\theta$ which are representations of the synchro shaft angle $\theta$. The two scanned signals are coupled to a sample and hold device in input multiplexer 10 and thence to an octant detector 20 that determines the particular octant in which the particular shaft angle $\theta$ lies and to an $E_1$, $E_2$ selector 22. The smaller signal, designated $E_1$, is coupled to a first input terminal of linearizing network 24 while the larger signal, designated $E_2$, is coupled to a second input terminal of linearizing network 24.

From the first and second signals $E_1$, $E_2$ a reference signal $-E_3$ is generated that biases a resistance ladder network 26. Bits from a data register 28, holding an approximated data word, are coupled to the resistance ladder network 26 generating an output current signal $-I_2$ that at a comparator 30 is compared to a current signal $I_1$ generated by signal $E_1$. The comparator 30 compares $I_1$ to $-I_2$ generating a current signal $I_3$, i.e., $I_1 - I_2 = \pm I_3$, which through the comparator 30 alternatively couples a binary signal "1" or "0" to control logic 32 which then adjusts the bits of the approximated data word held in data register 28. Through the successive approximation method the approximated data word is stepwise corrected to the final data word representing $\theta_D$.

Figure 2:
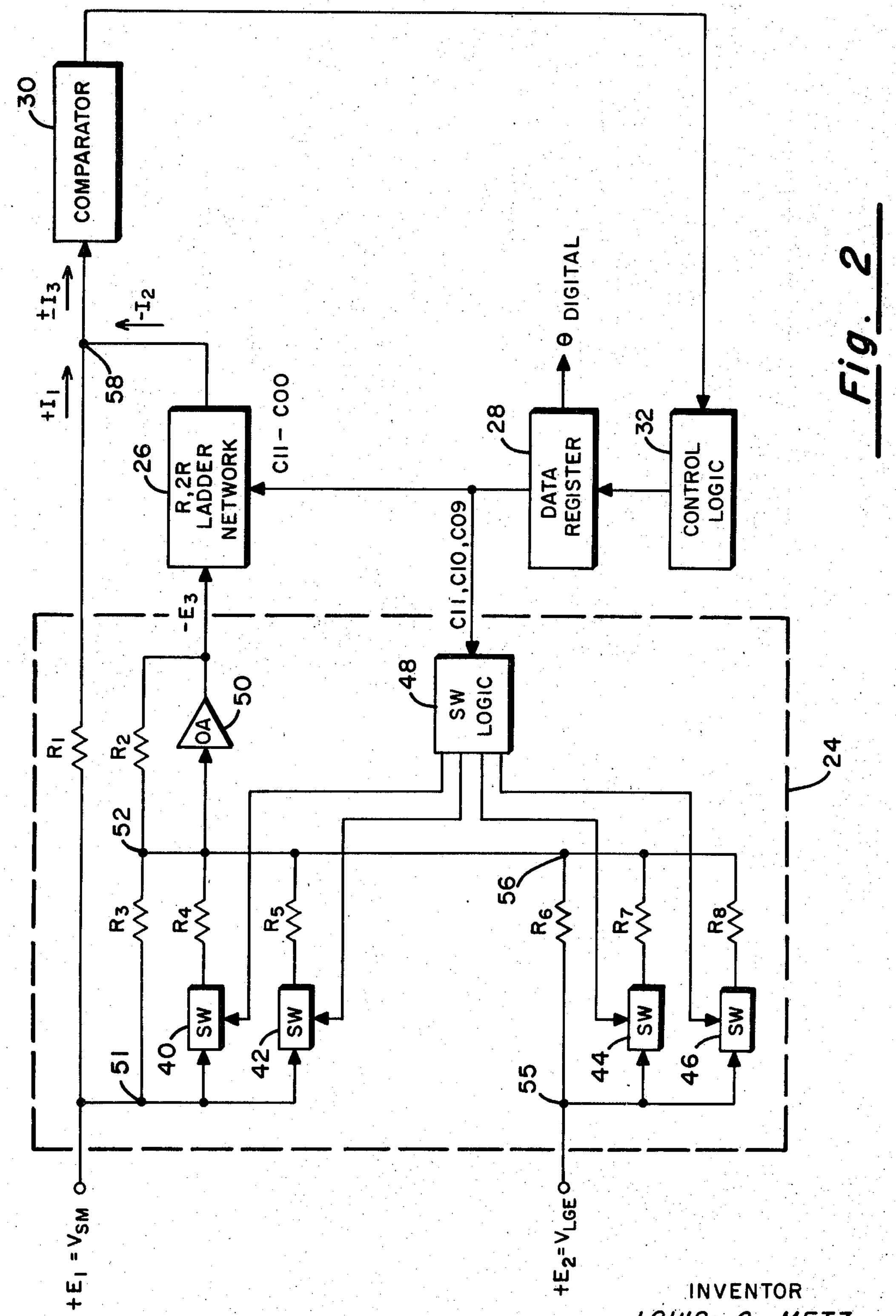
FIG. 2 is a detailed circuit schematic of the linearizing network of the present invention.

With particular reference to FIG. 2 there is presented a more detailed circuit schematic of the linearizing network 24 and its relationship with resistance ladder network 26, data register 28, comparator 30 and control logic 32. Linearizing network 24 includes a plurality of analog switches 40, 42, 44, 46 — see the publication "Electronic Analog Switches", Hermann Schmid, Electro-Technology, June 1968, pages 35 – 50 —that are selectively enabled or disabled by switch logic 48 under control of the highest ordered bits C11, C10, C09, of the data word held in data register 28. Switch logic 48, in accordance with the binary signal "1" or "0" of the highest ordered bits C11, C10, C09 of the approximated 12-bit data word (bits C11 – C00) in data register 28, enables or disables selected ones of analog switches 40, 42, 44, 46 in accordance with Table A.

TABLE A

| $\theta$ | Bits C11, | C10, | C09 | SW 40 | SW 42 | SW 44 | SW 46 |
|---|---|---|---|---|---|---|---|
| $0 \leq \theta < 22.5$ | 0 | 0 | 0 | OFF | OFF | ON | ON |
| | 0 | 0 | 1 | | | | |
| $22.5 \leq \theta < 33.75$ | 0 | 1 | 0 | ON | OFF | ON | OFF |
| $33.75 \leq \theta \leq 45$ | 0 | 1 | 1 | ON | ON | OFF | OFF |
| | 1 | 0 | 0 | | | | |

As an example, for the start of the successive approximation method bit C11 is set to a "1" while all other bits are cleared to a "0" representing an initial one-half full scale approximated data word. Bits C11, C10, C09 enable analog switches 40, 42 and disable analog switches 44, 46 whereupon resistors $R_3$, $R_4$, $R_5$ are coupled in parallel across nodes 51, 52 and only resistor $R_8$ is coupled across nodes 55, 56. These resistance combinations couple voltage signals $E_1$, $E_2$ to the input of operational amplifier 50 which along with feedback resistor $R_2$ generate a reference voltage $-E_3$ which is coupled to the input of resistance ladder network 26. These circuits associated with resistors $R_3$, $R_4$, $R_5$ and resistors $R_6$, $R_7$, $R_8$ are utilized to compensate for the nonlinear relationship existing between the given shaft angle $\theta$ and its equivalent trigonometric function.

The conversion technique is used over the range 0° to 45° while in order to limit the inherent error to 5 minutes of arc the 45° range is divided into three angular segments:

$$0° \leq \theta < 22.5°$$

$$22.5° \leq \theta < 33.75°$$

$33.75° \leq \theta \leq 45°$. These angular segments are established by the selective enabling or disabling of analog switches 40, 42, 44, 46 under control of switch logic 48 and as determined by the binary signal "1" or "0" of the three highest ordered bits C11, C10, C09 of the approximated data word in data register 28. The analog switches select various combinations of resistance values in the linearizing network which, in turn, control the overall gain of operational amplifier 50. The output of operational amplifier 50 couples the reference voltage $-E_3$ to the input of resistance ladder network 26 for biasing the resistance ladder in the desired manner. The resistance ladder is scaled under control of the bits C11–C00 of the approximated data word in data register 28 coupling an output current $-I_2$ to node 58 of comparator 30. Concurrently, voltage $+E_1$ through Resistor $R_1$ couples a current signal $+I_1$ to node 58 providing a comparison current signal $\pm I_3$ as an input to comparator 30. Comparator 30 for a comparison current signal $+I_3$ couples a "1" or for a comparison current signal $-I_3$ couples a "0" to control logic 32 incrementing or decrementing, respectively, the bits of the approximated data word in data register 28. Through changes in bits C11, C10, C09 switch logic 48 enables or disables analog switches 40, 42, 44, 46 effecting a corresponding change in reference voltage $-E_3$ while all bits C11–C00 scale the resistance ladder network 26 to effect corresponding changes in $-I_2$ and, consequently, $I_3$.

The linearizing network 24 operates under the following theory and conditions. Using the relationship, $\theta$ = Shaft Angle where $\theta$ is constrained to the following limits $0° \leq \theta \leq 45°$.

with the two input voltage signals from the synchro being $E_1 = K \sin\theta$ $E_2 = K \cos\theta$ the value of $\theta_D$ ($\theta_{Digital}$) is obtained from the following equation (1), $$\theta_D \cong \frac{E_1}{aE_1 + bE_2} \times 45° \qquad (1)$$

which yields Equation (2), $$\theta_D \cong \frac{\sin\theta}{a\sin\theta + b\cos\theta} \times 45° \qquad (2)$$

over the constrained limits.

To limit the inherent error in equation (2) to 5 minutes or less of arc over the constrained limits, the 45° range is divided into three angular segments each having its own values for the parameters a and b as listed in Table B.

TABLE B

| Angular Segment | a | b |
|---|---|---|
| $0° \leq \theta < 22.5°$ | 0.15228 | 0.76535 |
| $22.5° \leq \theta < 33.75°$ | 0.24719 | 0.72418 |
| $33.75° \leq \theta \leq 45.0°$ | 0.32916 | 0.66930 |

In the linearizing network 24 of FIG. 2:

the values of resistors $R_2$, $R_3$, $R_4$, $R_5$ and the conditions of analog switches 40, 42 determine the parameter a;

the values of resistors $R_2$, $R_6$, $R_7$, $R_8$ and the conditions of analog switches 44, 46 determine the parameter b. Further, the analog switches 40, 42, 44, 46 are selectively enabled ON, i.e., closed switch, or disabled OFF, i.e., open switch, under control of switch logic 48 as determined by the highest ordered bits C11, C10, C09 of the approximated data word bits C11 14 C00 in data register 28, i.e., the value of $\theta_D$, so that the parameters *a* and *b* have the values noted in Table B.

The reference voltage $-E_3$, which is the output of operational amplifier 50 and the input of resistance ladder network 26, is represented by the equation (3).

$$E_3 = -(aE_1 + bE_2).$$

Reference voltage $-E_3$ is coupled to the comparator 30 null point 58 through linear R, 2R resistance ladder network 26 whose transfer ratio is proportional to $\theta_D$ (0.5 is equivalent to 45°) and whose output impedance is equal to 0.5 resistor $R_1$. When comparator 30 input $I_3$ is null or zero, current signal $I_2$ is represented by, $$I_2 = \frac{E_3\theta_D}{0.5R_1} \times \frac{0.5}{45°} = \frac{E_3\theta_D}{R_1 45°}$$

Substituting in equation (3) gives equation (4), $$I_2 = \frac{-(aE_1+bE_2)\theta_D}{R_1 45°} \quad (4)$$

With the comparator 50 input at null, $$I_1 = E_1/R_1 \quad (5)$$

and, $$I_3 = 0$$

and as $$I_3 = I_1 + I_2$$

then, $$I_1 + I_2 = 0.$$

Substituting in equations (4), (5), $$\frac{E_1}{R_1} + \frac{-(aE_1+bE_2)\theta_D}{R_1 45°} = 0$$

$$E_1 - (aE_1+bE_2)\frac{\theta_D}{45°} = 0$$

$$E_1 = (aE_1+bE_2)\frac{\theta_D}{45°}$$

$$\frac{E_1 45°}{aE_1+bE_2} = \theta_D$$

which is equation (1). This value of $\theta_D$ is subsequently added to or subtracted from the quadrant angle determined by octant selector 20 of FIG. 1.

Figure 4:
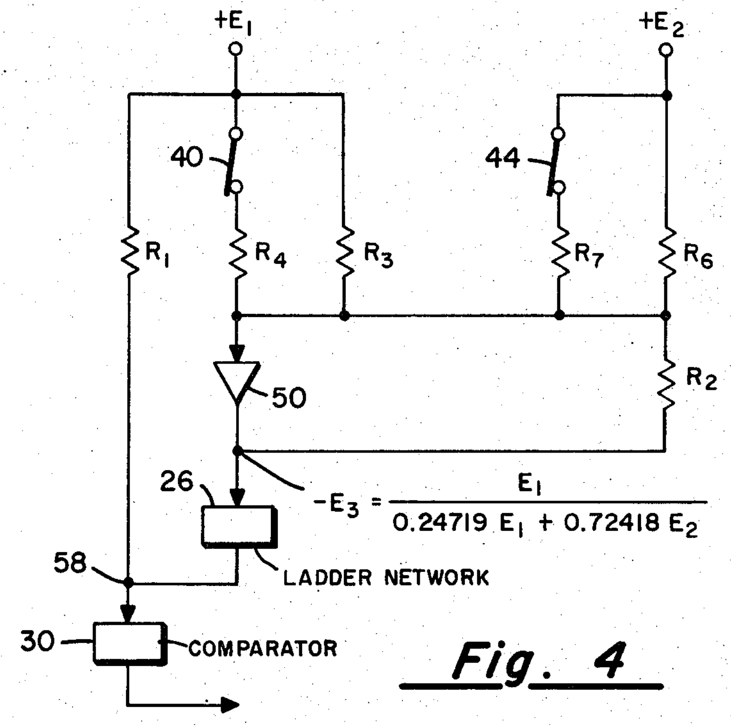
FIG. 4 is the equivalent circuit schematic of the linearizing circuit of FIG. 2 for the range $2\ .5° \leq \theta < 33.75°$.
Figure 3:
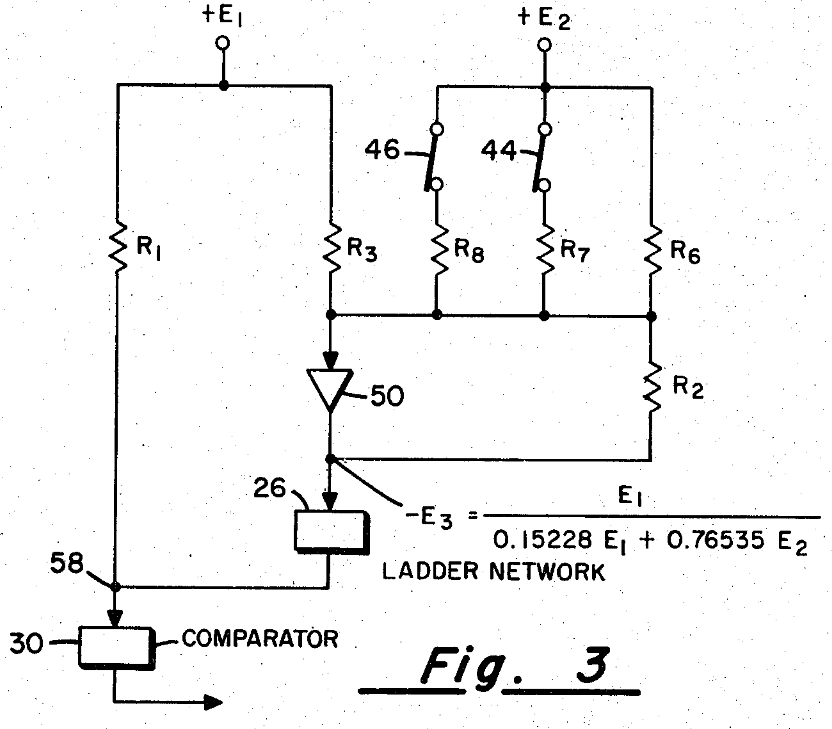
FIG. 3 is the equivalent circuit schematic of the linearizing circuit of FIG. 2 for the range $0° \leq \theta < 22.5°$.
Figure 5:
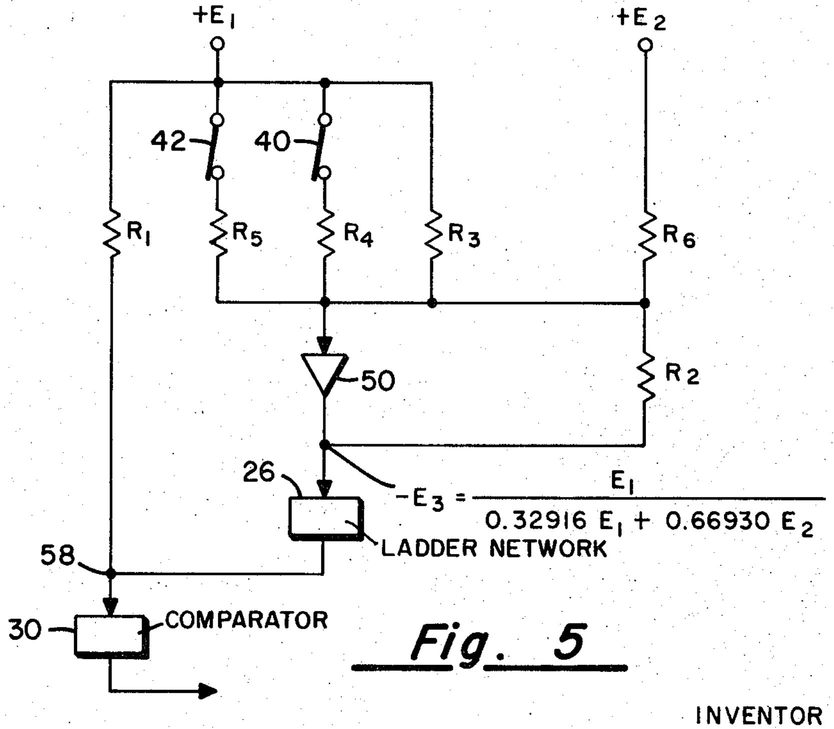
FIG. 5 is the equivalent circuit schematic of the linearizing circuit of FIG. 2 for the range $33.75° \leq \theta \leq 45°$.

With particular reference to FIGS. 3, 4, 5 there are presented the equivalent circuit schematics for the three angular segments, $$0° \leq \theta \leq 22.5° \quad \text{FIG. 3,}$$

$$22.5° \leq \theta < 33.75° \quad \text{FIG. 4,}$$

$$33.75° \leq \theta \leq 45° \quad \text{FIG. 5,}$$

as determined by the enabling or disabling of analog switches 40, 42, 44, 46 by switch logic 48 under control of the three highest ordered bits C11, C10, C09 of the approximated data word in data register 28, and as detailed in Table A.

What is claimed is:

1. In a shaft-angle to digital-data converter wherein $E_1$ and $E_2$ signals which are representative of first and second trigonometric functions, respectively, of said shaft angle $\theta$, are through the successive approximation method converted to a multibit data word held in a data register, which data word is representative of said shaft angle $\theta$, using a ladder network having a reference $-E_3$ signal input for converting the approximated data word held in the data register to a $-I_2$ signal and a resistor network for converting said $E_1$ signal to a $+I_1$ signal, a comparator for comparing said $+I_1$ and $-I_2$ signals and generating a binary output that is representative of said comparison, and control logic for changing said approximated data word in said data register in response to said binary output, the improvement comprising:

$E_1$ signal means for providing an $E_1$ voltage signal that is representative of a first trigonometric function of said shaft angle $\theta$;

$E_2$ signal means for providing an $E_2$ voltage signal that is representative of a second trigonometric function of said shaft angle $\theta$;

amplifier means for providing at its output a $-E_3$ voltage signal in response to said $E_1$ and $E_2$ voltage signals;

first and second switch means coupled to said $E_1$ signal means;

first and second resistor means each coupling the associated first and second switch means, respectively, to the input of said amplifier means;

third and fourth switch means coupled to said $E_2$ signal means;

third and fourth resistor means, each coupling the associated third and fourth switch means, respectively, to the input of said amplifier means;

$+I_1$ signal means coupled to said $E_1$ signal means for generating a $+I_1$ current signal;

switch logic means selectively enabling said first, second, third and fourth switch means for changing the gain of said amplifier means and generating a corresponding change in said $-E_3$ voltage signal;

means coupled to said amplifier means and generating a $-I_2$ current signal from said $-E_3$ voltage signal and coupled to said $+I_1$ signal means and responding to the difference between said $+I_1$ and $-I_2$ current signals for controlling said switch logic means.

2. In a shaft-angle to digital-data converter wherein $E_1$ and $E_2$ signals which are representative of first and second trigonometric functions, respectively, of said shaft angle $\theta$, are through the successive approximation method converted to a multibit data word held in a data register, which data word is representative of said shaft angle $\theta$, using a ladder network having a reference $-E_3$ signal input for converting the approximated data word held in the data register to a $-I_2$ signal and a resistor network for converting said $E_1$ signal to a $+I_1$ signal, a comparator for comparing said $+I_1$ and $-I_2$ signals and generating a binary output that is representative of said comparison, and control logic for changing said approximated data word in said data register in response to said binary output, the improvement comprising:

$E_1$ signal means for providing an $E_1$ voltage signal that is representative of a first trigonometric function of said shaft angle $\theta$;

$E_2$ signal means for providing an $E_2$ voltage signal that is representative of a second trigonometric function of said shaft angle $\theta$;

amplifier means for providing at its output a $-E_3$ voltage signal in response to said $E_1$ and $E_2$ voltage signals;

first and second switch means coupled to said $E_1$ signal means;

first and second resistor means each coupling the associated first and second switch means, respectively, to the input of said amplifier means;

third and fourth switch means coupled to said $E_2$ signal means;

third and fourth resistor means, each coupling the associated third and fourth switch means, respectively, to the input of said amplifier means;

fifth resistor means coupling said $E_1$ signal means to the input of said amplifier means;

sixth resistor means coupling said $E_2$ signal means to the input of said amplifier means;

seventh resistor means intercoupling the input and output of said amplifier means;

means coupled to said data register selectively enabling said first, second, third and fourth switch means in response to said approximated data word for changing the gain of said amplifier means and coupling a correspondingly changed $-E_3$ signal to said ladder network.

3. In a shaft-angle to digital-data converter, the apparatus comprising:

$E_1$ signal means for providing an $E_1$ voltage signal that is representative of a first trigonometric function of said shaft angle $\theta$;

$E_2$ signal means for providing an $E_2$ voltage signal that is representative of a second trigonometric function of said shaft angle $\theta$;

amplifier means for providing at its output a $-E_3$ voltage signal in response to said $E_1$ and $E_2$ voltage signals;

a first plurality of switch means coupled to said $E_1$ signal means;

a first plurality of resistor means for parallely coupling an associated one of said first plurality of switch means to the input of said amplifier means;

a second plurality of switch means coupled to said $E_2$ signal means;

a second plurality of resistor means for parallely coupling an associated one of said second plurality of switch means to the input of said amplifier means;

a resistor ladder network for providing at its output a $-I_2$ current signal;

means coupling said $-E_3$ voltage signal output of said amplifier means to the input of said ladder network;

a comparator;

means coupling said $-I_2$ current signal output of said ladder network to said comparator;

means including a resistor means for coupling a $+I_1$ current signal from said $E_1$ signal means to said comparator;

said comparator comparing said $+I_1$ and $-I_2$ current signals and alternatively providing at its output a first and a second one of a binary signal that is representative of said comparison;

control logic means;

data register means for holding a multibit data word;

means for coupling said binary signal to said control logic means;

means coupling said control logic means to said data register means for changing said multibit data word held in said data register means in response to said binary signal;

means coupling said data register means to said first and second plurality of switch means for selectively enabling said first and second plurality of switch means in response to said changing multibit data word held in said data register and changing said $-E_3$ voltage signal in response thereto; and, means coupling said data register means to said ladder network for enabling both said changing multibit data word held in said data register means and said changing $-E_3$ voltage signal to generate a corresponding change in said $-I_2$ current signal.

* * * * *